US008873345B2

(12) United States Patent
Takenawa (10) Patent No.: US 8,873,345 B2
(45) Date of Patent: Oct. 28, 2014

(54) SOLAR POWER GENERATING DEVICE AND ELECTRONIC TIMEPIECE

(71) Applicant: Casio Computer Co., Ltd., Tokyo (JP)

(72) Inventor: Hideo Takenawa, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 55 days.

(21) Appl. No.: 13/853,678

(22) Filed: Mar. 29, 2013

(65) Prior Publication Data

US 2013/0258822 A1    Oct. 3, 2013

(30) Foreign Application Priority Data

Apr. 2, 2012  (JP) ................................. 2012-083637

(51) Int. Cl.
*G04C 10/02* (2006.01)
*H01L 31/042* (2014.01)
*H01L 31/05* (2014.01)

(52) U.S. Cl.
CPC ............ *G04C 10/02* (2013.01); *H01L 31/0422* (2013.01); *Y02E 10/50* (2013.01); *H01L 31/042* (2013.01); *H01L 31/05* (2013.01)
USPC .......................................... 368/205; 136/251

(58) Field of Classification Search
CPC .. G04C 10/02; H01L 31/042; H01L 31/0422; H01L 31/05
USPC ..................... 368/64, 203–205; 136/244, 251
See application file for complete search history.

(56) References Cited

U.S. PATENT DOCUMENTS

| 3,427,797 | A  | * | 2/1969 | Negoro et al. | ................. 368/205 |
| 6,122,226 | A  | * | 9/2000 | Murakami et al. | .............. 368/80 |
| 6,521,822 | B2 | * | 2/2003 | Ito et al. | ......................... 136/244 |
| 7,057,102 | B2 | * | 6/2006 | Nagasawa | ..................... 136/251 |
| 2006/0050618 | A1 | * | 3/2006 | Osa et al. | ....................... 368/205 |
| 2006/0153011 | A1 | * | 7/2006 | Osa et al. | ....................... 368/205 |
| 2012/0057439 | A1 | * | 3/2012 | Shimizu et al. | ............... 368/205 |
| 2012/0120776 | A1 | * | 5/2012 | Fleury et al. | .................. 368/205 |

FOREIGN PATENT DOCUMENTS

JP          2010-078507 A     4/2010

* cited by examiner

*Primary Examiner* — Vit W Miska
(74) *Attorney, Agent, or Firm* — Holtz, Holtz, Goodman & Chick PC (57) ABSTRACT

A solar power generating device of the present invention includes a first solar section which has a plurality of solar cells arranged flatwise, a second solar section which has a plurality of solar cells arranged flatwise and is placed a predetermined space away and below the first solar section so as to be shifted with respect to the first solar section in a surface direction, and a coupling section which couples the first solar section and the second solar section together. In the solar power generating device, the coupling section has a connecting section placed in an area below the second solar section, and the connecting section is provided with contact terminals to which the first solar section and the second solar section are electrically connected.

20 Claims, 7 Drawing Sheets

SOLAR POWER GENERATING DEVICE AND ELECTRONIC TIMEPIECE

CROSS-REFERENCE TO RELATED APPLICATION

This application is based upon and claims the benefit of priority from the prior Japanese Patent Application No. 2012-083637, filed Apr. 2, 2012, the entire contents of which is incorporated herein by reference.

BACKGROUND OF THE INVENTION

1. Field of the Invention

The present invention relates to a solar power generating device for use in an electronic device such as an electronic watch, and an electronic timepiece including the solar power generating device.

2. Description of the Related Art

A known example of a solar power generating device for use in an electronic watch is structured to include a first solar section placed on the lower surface of a translucent hour plate and a second solar section placed along the outer perimeter of the first solar section, and to increase a light-receiving area by the second solar section, as described in Japanese Patent Application Laid-Open (Kokai) Publication No. 2010-078507

This type of solar power generating device is structured so that the first solar section and the second solar section are each provided with a plurality of solar cells the first solar section and the second solar section are individually formed, the first solar section is electrically connected to a circuit board via a coil spring, and the second solar section is electrically connected to a circuit board via a lead wire.

However, in this solar power generating device, the first solar section and the second solar section have to be separately formed and individually assembled, and the first solar section and the second solar section have to be electrically connected to a circuit board individually. Therefore, the assembling operation and the connecting operation are cumbersome and troublesome.

The present invention provides a solar power generating device and electronic watch in which a plurality of solar sections are integrated to simplify the assembling operation and the connecting operation.

SUMMARY OF THE INVENTION

In accordance with one aspect of the present invention, there is provided a solar power generating device comprising; a first solar section which has a plurality of solar cells arranged flatwise; a second solar section which has a plurality of solar cells arranged flatwise and is placed a predetermined distance away and below the first solar section so as to be shifted with respect to the first solar section in a surface direction; and a coupling section which couples the first solar section and the second solar section together, wherein the coupling section has a connecting section placed in an area below the second solar section, and the connecting section is provided with contact terminals to which the first solar section and the second solar section are electrically connected.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

DETAILED DESCRIPTION OF THE PREFERRED EMBODIMENTS (First Embodiment)

A first embodiment in which the present invention has been applied to a pointer-type electronic watch (electronic timepiece) is described with reference to FIG. 1 to FIG. 3.

Figure 1:
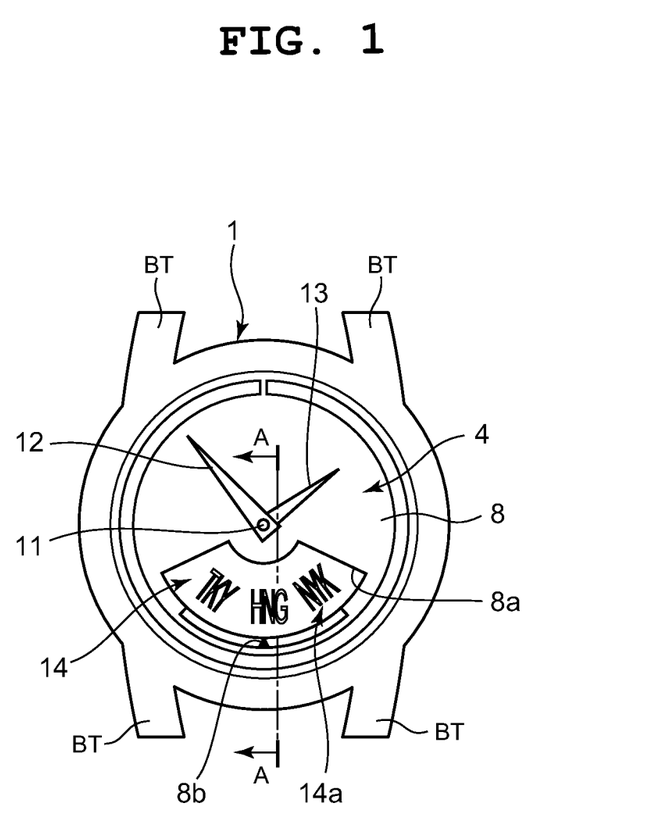
FIG. 1 is an enlarged front view of a first embodiment in which the present invention has been applied to an electronic watch.

The electronic watch includes a watch case 1 as depicted in FIG. 1. A clock glass 2 is mounted on the upper opening of the watch case 1 as depicted in FIG. 1 and FIG. 2, and a rear lid 3 is mounted on the lower portion of the watch case 1. A band mount section BT is provided on the twelve o'clock side and the six o'clock side of the watch case 1.

Figure 2:
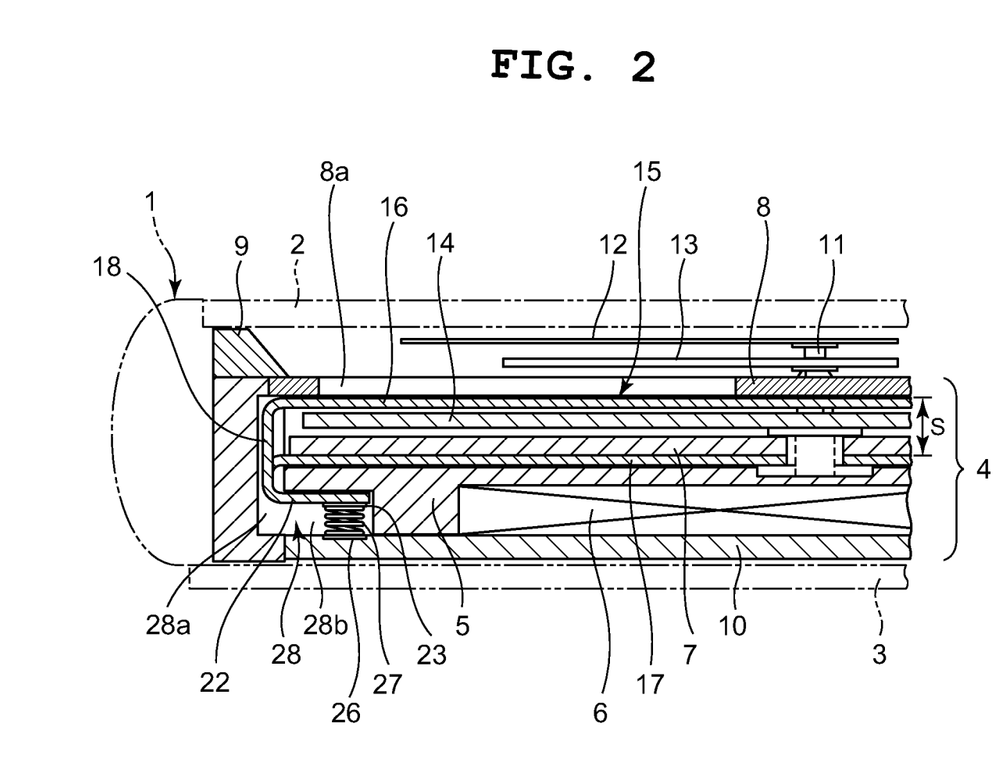
FIG. 2 is an enlarged sectional view of the main section of the electronic watch taken along line A-A in FIG.

Also, a clock module 4 is incorporated inside the watch case 1 as depicted in FIG. 2. The clock module 4 includes a housing 5. Inside the housing 5, a clock movement 6 is provided. On the upper surface of the housing 5, a lower hour plate 7 is placed. The lower hour plate 7 is formed in an approximately semicircular shape. Above the lower hour plate 7, as depicted in FIG. 2, an upper hour plate 8 is placed a predetermined space S away from the lower hour plate 7. The upper hour plate 8 is formed in an approximately circular shape.

As depicted in FIG. 1 and FIG. 2, the upper hour plate 8 is provided with a display opening 8a correspondingly to the lower hour plate 7. The display opening 8a is formed in a fan shape approximately similar to a semicircle as depicted in FIG. 1. Above the outer perimeter of the upper hour plate 8, a ring-shaped parting member 9 is placed. A circuit board 10 is provided on the lower portion of the housing 5 via a board presser plate (not shown).

As depicted in FIG. 1 and FIG. 2, the clock movement 6 is structured to rotate a pointer shaft 11 to move a minute hand 12 and an hour hand 13 to indicate time and to rotate a display rotor plate 14 to display information about world's main cities and others. That is, the clock movement 6 normally moves the minute hand 12 and the hour hand 13 to indicate the current time and, when rotating the display rotor plate 14 to display any of the world's main cities displayed on an information display section 14a, indicate the time in the city with the minute hand 12 and the hour hand 13.

In this case, the pointer shaft 11 has a plurality of rotating shafts for the minute hand 12, the hour hand 13, the display rotor plate 14, and for other purposes on the same axis. As depicted in FIG. 2, the pointer shaft 11 projects through the lower hour plate 7 and the upper hour plate 8 toward a lower side of the clock glass 2. On the upper portion of the pointer shaft 11, the minute hand 12 and the hour hand 13 are mounted. The display rotor plate 14 is mounted on the intermediate portion of the pointer shaft 11 positioned between the lower hour plate 7 and the upper hour plate 8.

The display rotor plate 14 is a disk pointer as depicted in FIG. 1 and FIG. 2, and is formed in an approximately circulate plate shape made of a translucent material, with its center mounted on the pointer shaft 11. The display rotor plate 14 is structured to have an upper surface provided with the information display section 14a and to rotate over the lower hour plate 7 together with the pointer shaft 11 rotated by the clock movement 6.

In this case, as depicted in FIG. 1 and FIG. 2, the information display section 14a of the display rotor plate 14 is structured so that the information about the world's main cities and others is displayed along the perimeter of the display rotor plate 14 and, when part of the displayed information, that is, any of the world's main cities, is exposed upward so as to correspond to the display opening 8a of the upper hour plate 8, one of the world's main cities is indicated by an indication mark 8b.

Meanwhile, the clock module 4 includes a solar power generating device 15 as depicted in FIG. 2. The solar power generating device 15 includes, as depicted in FIG. 2 and FIG. 3, a first solar section 16 placed on the lower surface of the upper hour plate 8, a second solar section 17 placed on the lower surface of the lower hour plate 7, and a coupling section 18 coupling these first and second solar sections 16 and 17 together.

In this case, the lower hour plate 7 and the upper hour plate 8 are each formed of a transparent or translucent material. Also, as depicted in FIG. 3, the first and second solar sections 16 and 17 and the coupling section 18 are integrally formed of a flexible film. The first solar section 16 is formed in an approximately semicircular shape as depicted in FIG. 3, and has an upper surface on which a plurality of solar cells 20 are arranged flatwise.

As with the first solar section 16, the second solar section 17 is formed in an approximately semicircular shape, and has an upper surface on which a plurality of solar cells 21 are arranged flatwise. As depicted in FIG. 2 and FIG. 3, the second solar section 17 is structured to be placed the predetermined space S away and below the first solar section 16 so as to hardly overlap with the first solar section 16 and be shifted as being rotated almost 180 degrees in a surface direction.

Figure 3:
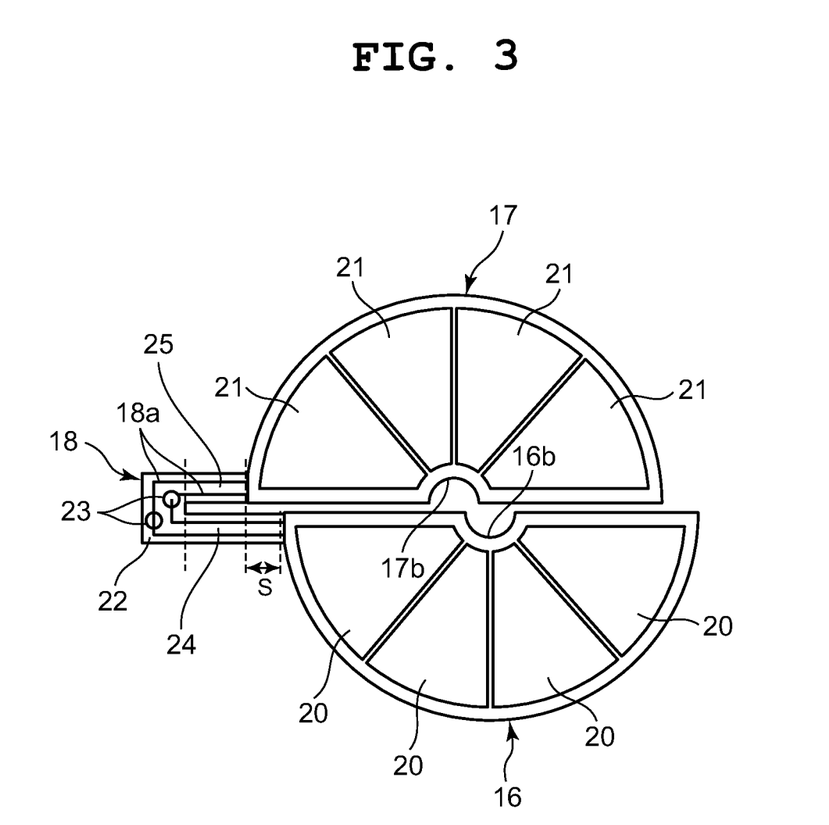
FIG. 3 is an enlarged development view in which a solar power device of the electronic watch depicted in FIG. 2 has been developed.

That is, as depicted in FIG. 3, the first solar section 16 and the second solar section 17 are structured to be placed so that chords of the respective semicircles oppose each other. Also, semicircular notched holes 16b and 17b where the pointer shaft 11 is inserted are provided each at an intermediate portion of each semicircle chords of the first solar section 16 and the second solar section 17, respectively.

As depicted in FIG. 2 and FIG. 3, the coupling section 18 positioned on a side of the first solar section 16 and the second solar section 17 is structured to bendably couple the first solar section 16 and the second solar section 17 together, and to have a connecting section 22 bent toward inside of an area positioned below the second solar section 17. The connecting section 22 is provided with paired contact terminals 23 to which the first solar section 16 and the second solar section 17 are electrically connected. The coupling section 18 is provided with a wiring pattern 18a for electrically connecting the solar cells 20 and 21 of the first and second solar sections 16 and 17 and the paired contact terminals 23 together.

As depicted in FIG. 3, the coupling section 18 has a first coupling piece 24 that couples the connecting section 22 positioned on the side (at left in FIG. 3) of the first solar section 16 and the second solar section 17 and the first solar section 16 together and also has a second coupling piece 25 that couples the connecting section 22 and the second solar section 17 together positioned. In this case, the first coupling piece 24 is formed longer than the second coupling piece 25 by the predetermined space S in the vertical direction between the first solar section 16 and the second solar section 17, that is, by the predetermined space S above the lower hour plate 7 and below the upper hour plate 8.

As depicted in FIG. 3, the first coupling piece 24 of the coupling section 18 is bendably coupled to one end (upper left portion in FIG. 3) of the outer perimeter of the semicircle of the first solar section 16 and the lower portion of one side (right side in FIG. 3) of the connecting section 22. The second coupling piece 25 is bendably coupled to one end (lower left portion in FIG. 3) of the outer perimeter of the semicircle of the second solar section 17 adjacent to the one end of the first solar section 16 and the upper portion of one side (right side in FIG. 3) of the connecting section 22 in a state parallel to the first coupling piece 24.

On the other hand, the paired contact terminals 23 of the coupling section 18 are structured, as depicted in FIGS. 2 and 3, so as to be electrically connected to paired connection electrodes 26 on the circuit board 10 positioned below the second solar section 17 via paired coil springs 27 (connecting members). In this case, in the housing 5 where the circuit board 10 is placed, as depicted in FIG. 2, a coupling accommodating section 28 where the coupling section 18 is inserted and placed is provided so as to correspond to the paired connection electrodes 26 on the circuit board 10.

The coupling accommodating section 28 includes, as depicted in FIG. 2, a guide hole 28a continuously provided at a position corresponding to the outer perimeter of the upper hour plate 8 and a position corresponding to the outer perimeter of the lower hour plate 7 and in which the first and second coupling pieces 24 and 25 are to be inserted, and an accommodation recess 28b provided in the housing 5 positioned below the outer perimeter of the second solar section 17 from the guide hole 28a and being open below the housing 5.

With this, as depicted in FIG. 2, the coupling section 18 is structured so that the first and second coupling pieces 24 and 25 are inserted in the guide hole 28a of the coupling accommodating section 28 together with the connecting section 22, the inserted connecting section 22 is bent toward inside of the accommodation recess 28b of the coupling accommodating section 28, and the contact terminals 23 of the bent connecting section 22 corresponds to the connection electrodes 26 on the circuit board 10 in the accommodation recess 28b.

As depicted in FIG. 2, the paired coil springs 27 are structured to be placed between the connecting section 22 and the circuit board 10 inside the accommodation recess 28b of the coupling accommodating section 28. In this state, with the upper end of the paired coil springs 27 being elastically in contact with the contact terminals 23 of the connecting section 22, the connecting section 22 is pressed onto the inner surface (lower surface of the upper portion in FIG. 2) of the housing 5 positioned at the upper inner portion of the accommodation recess 28b, and the lower end thereof is elastically in contact with the connection electrodes 26 of the circuit board 10, thereby electrically connecting the contact terminals 23 of the connecting section 22 and the connection electrodes 26 of the circuit board 10 together.

Next, a case of manufacturing the solar power generating device 15 is described.

In this case, the solar cells 20 and 21, the contact terminals 23, and the wiring pattern 18a are formed in advance at predetermined positions on the same plane (a front surface in FIG. 3) of one flexible film, and the film is then cut along the solar cells 20 and 21 and the wiring pattern 18a. With this, as depicted in FIG. 3, the first and second solar sections 16 and 17 and the coupling section 18 are formed as being integrally coupled together and developed.

In this state, as depicted in FIG. 3, the first solar section 16 is formed in an approximately semicircular shape, with its chord of the approximately semicircular shape being an upper chord. The second solar section 17 is formed in an approximately semicircular shape, with its chord of the approximately semicircular shape being a lower chord. With the chords of the first solar section 16 and the second solar section 17 opposing each other, the first solar section 16 and the second solar section 17 are placed so as to be shifted in a horizontal direction.

Also, in this state, as depicted in FIG. 3, the coupling section 18 is positioned on a side (at left in FIG. 3) of the first solar section 16 and the second solar section 17, and the first coupling piece 24 of the coupling section 18 is coupled to the lower portion on one side (right side in FIG. 3) of the connecting section 22 and the left end of the approximately semicircular shape of the first solar section 16, and the second coupling piece 25 is coupled to the upper portion on one side (right side in FIG. 3) of the connecting section 22 and the left end of the approximately semicircular shape of the second solar section 17.

In this case, as depicted in FIG. 3, the first coupling piece 24 is formed longer than the second coupling piece 25 by the predetermined space S above the lower hour plate 7 and below the upper hour plate 8. With this, the first solar section 16 is placed so as to be shifted by the predetermined space S above the lower hour plate 7 and below the upper hour plates to the opposite side (to right in FIG. 3) of the coupling section 18 from the second solar section 17.

Furthermore, in this state, as depicted in FIG. 3, the solar cells 20 of the first solar section 16 and the solar cells 21 of the second solar section 17 are formed on the upper surface of the film, and the contact terminals 23 of the coupling section 18 are also formed on the upper surface of the film. Therefore, the solar cells 20 and 21 are electrically connected to the contact terminals 23 of the coupling section 18 via the wiring pattern 18a on the same plane, that is, the upper surface, of the film.

In this state, the first coupling piece 24 of the coupling section 18 is bent downward at approximately the right angle at a coupling position with the first solar section 16, and the second coupling piece 25 is bent downward at approximately the right angle at a coupling position with the second solar section 17. Here, since the first coupling piece 24 is formed longer than the second coupling piece 25 by the predetermined space S above the lower hour plate 7 and below the upper hour plate 8 the first solar section 16 is positioned above the second solar section 17. With this the solar power generating device 15 is three-dimensionally formed.

Next, a case of assembling this three-dimensional solar power generating device 15 to the clock module 4 is described.

In this case, the clock movement 6 is assembled inside the housing 5 in advance, thereby causing the pointer shaft 11 to project upward from the housing 5. In this state, the lower hour plate 7 is placed on the second solar section 17, and the pointer shaft 11 is inserted into a shaft insertion hole (not shown) of the lower hour plate 7 and the notched hole 17b of the second solar section 17.

Then, the display rotor plate 14 is mounted on the pointer shaft 11 projecting upward from the lower hour plate 7, the first solar section 16 is placed above the display rotor plate 14, and the upper hour plate 8 is placed on the first solar section 16. Also at this time, the pointer shaft 11 is inserted in a shaft insertion hole (not shown) of the upper hour plate 8 and the notched hole 16b of the first solar section 16. In this state, while the coupling section 18 is being inserted from above into the guide hole 28a of the coupling accommodating section 28 of the housing 5, the second solar section 17 and the lower hour plate 7 are placed on the housing 5.

Then, the connecting section 22 of the coupling section inserted into the guide hole 28a of the coupling accommodating section 28 of the housing 5 is placed so as to be bent at approximately the right angle toward inside of the accommodation recess 28b of the coupling accommodating section 28. Here, the paired contact terminals 23 provided to the connecting section 22 of the coupling section 18 corresponding to the upper surfaces of the first solar section 16 and the second solar section 17, respectively, are placed so as to be oriented downward. In this state, the paired coil springs 27 are placed below the paired contact terminals 23, and the circuit board 10 is mounted on the lower surface of the housing 5 via the board presser plate (not shown).

With this, as depicted in FIG. 2, the paired coil springs 27 are interposed in the accommodation recess 28b of the coupling accommodating section 28 between the connecting section 22 and the circuit board 10. Then, in this state, the upper end of the coil springs 27 is elastically brought in contact with the contact terminals 23 of the connecting section 22 to press the connecting section 22 onto the housing 5 positioned above the accommodation recess 28b, the lower end of the coil springs 27 is elastically brought in contact with the connection electrodes 26 of the circuit board 10.

With this, with the paired contact terminals 23 of the connecting section 22 and the paired connection electrodes 26 of the circuit board 10 being electrically connected to each other, the solar power generating device 15 is assembled to the housing 5. Then, the minute hand 12 and the hour hand 13 are mounted on the upper portion of the pointer shaft 11 projecting upward from the upper hour plate 8. In this state, the solar power generating device 15 is incorporated in the watch case 1 together with the housing 5.

Next, the operation of the electronic watch described above is described.

In the electronic watch, the pointer shaft 11 is usually rotated by the clock movement 6, and the minute hand 12 and the hour hand 13 are moved accordingly above the upper hour plate 8 to indicate the current time. Also, when the pointer shaft 11 is rotated by the clock movement 6 and the display rotor plate 14 is rotated between the lower hour plate 7 and the upper hour plate 8 with the rotation of the pointer shaft 11, part of the world's main cities on the information display section 14a provided on the upper surface of the display rotor plate 14 corresponds to the display opening 8a of the upper hour plate 8.

That is, part of the world's main cities on the information display section 14a provided on the upper surface of the display rotor plate 14 is exposed through the display opening 8a of the upper hour plate 8 and, when one of the city names on the information display section 14a is indicated and displayed by the indication mark 8b, the time in the indicated and displayed city is indicated by the minute hand 12 and the hour hand 13.

In this state, external light enters the watch case 1 through the clock glass 2 and, with this incident external light, the solar power generating device 15 generates power. That is, of the external light entering the watch case 1, light applied to the upper hour plate 8 transmits through the upper hour plate 3 to be applied to the first solar section 16 and, by this applied light, the solar cells 20 of the first solar section 16 generate power.

Similarly, light transmitting through the display opening 8a of the upper hour plate 8 transmits through the display rotor plate 14 positioned therebelow to be applied to the lower hour plate 7. Then, the applied light further transmits through the lower hour plate 7 to be applied to the second solar section 17. By this applied light, the solar cells 21 of the second solar section 17 generate power.

In this case, the lower hour plate 7 and the upper hour plate 8 have different heights and, even when the display rotor plate 14 is placed between the lower hour plate 7 and the upper hour plate 8, a light-receiving area is ensured by the first and second solar sections 16 and 17. Then, sufficient power is generated by the solar cells 20 and 21 of the first and second solar sections 16 and 17.

Thus generated power is sent from the paired contact terminals 23 of the coupling section 18 via the paired coil springs 27 to the paired connection electrodes 26 of the circuit board 10, and is then temporarily accumulated in a power supply section (not shown) such as a capacitor of the circuit board 10. By this accumulated power, the clock movement 6 is driven.

As such, the solar power generating device 15 of the electronic watch is structured to include the first solar section 16 which has the plurality of solar cells 20 arranged flatwise, the second solar section 17 which has the plurality of solar cells 21 arranged flatwise and is placed to be the predetermined space S away and below the first solar section 16 so as to be shifted with respect to the first solar section 16 in the surface direction, and the coupling section 18 which bendably couples the first solar section 16 and the second solar section 17 together, and the coupling section 18 has the connecting section 22 in an area below the second solar section 17, and the connecting section 22 is provided with the paired contact terminals 23 to which the first solar section 16 and the second solar section 17 are electrically connected. Thus, with the plurality of solar sections 16 and 17 being integrated together, the assembling operation and the connecting operation can be simplified.

That is, in the solar power generating device 15, via the coupling section 18, the first solar section 16 and the second solar section 17 can be coupled and integrated and the first solar section 16 and the second solar section 17 can be electrically connected to the paired contact terminals 23 of the coupling section 18. Thus, the first and second solar sections 16 and 17 can be concentrated on the contact terminals 23 at one position. Therefore, there is no need to individually assemble and individually connect the first and second solar sections 16 and 17, and these solar sections can be assembled and connected all together. Therefore, even if the device includes the plurality of solar sections 16 and 17, these can be integrated to simplify the assembling operation and the connecting operation.

With this, the connection space can be minimized and thereby the entire device can be downsized. Also, even though the first and second solar sections 16 and 17 have different heights according to the heights of the lower hour plate 7 and the upper hour plate 8, the first and second solar sections 16 and 17 can be excellently placed via the coupling section 18, and the light-receiving area can be ensured. Also, a sufficient amount of power generation can be ensured. In this case, since the first solar section 16, the second solar section 17, and the coupling section 18 are integrally coupled with the flexible film, these sections can be manufactured only by cutting the single film. Also, by bending the coupling section 18, the first solar section 16 and the second solar section 17 can be easily placed so as to be shifted by the predetermined space S in the vertical direction. With this, the first solar section 16 and the second solar section 17 can be three-dimensionally structured with ease.

In this case, the contact terminals 23 and the wiring pattern 18a are formed only on one side of the coupling section 18, and there is no need to form a wireless pattern on both sides. Therefore, the coupling section 18 can be easily manufactured. Also, since the contact terminals 23 are provided to the connecting section 22 of the coupling section 18, the positions of the contact terminals 23 can be freely set by bending the connecting section 22. This facilitates pattern designing of the connection electrodes 26 of the circuit board 10 and others, thereby increasing flexibility in pattern designing of the circuit board 10.

Also, the coupling section 18 has the first coupling piece 24 that couples the connecting section 22 and the first solar section 16 together and the second coupling piece 25 that couples the connecting section 22 and the second solar section 17 together, and the first coupling piece 24 is formed so as to be longer than the second coupling piece 25 by the predetermined space S in the vertical direction between the first solar section 16 and the second solar section 17. With this, only by bending the first coupling piece 24 downward at the coupling portion with the first solar section 16 at approximately the right angle and bending the second coupling piece 25 downward at the coupling portion with the second solar section 17 at approximately the right angle, the first solar section 16 and the second solar section 17 can be easily placed so as to be shifted by the predetermined space S in the vertical direction.

In this case, the first coupling piece 24 of the coupling section 18 is bendably coupled to one end of the outer perimeter of the first solar section 16 and one side of the connecting section 22 of the coupling section 18, and the second coupling piece 25 is bendably coupled to one end of the outer perimeter of the second solar section 17 adjacent to the one end of the first solar section 16 and one side of the connecting section 22 of the coupling section 18 in a state in parallel to the first coupling piece 24. With this, the first solar section 16 and the second solar section 17 can be coupled together in a compact manner, and the coupling section 18 can be placed in the housing 5 in a compact manner.

Also, in the solar power generating device 15, the contact terminals 23 of the connecting section 22 of the coupling section 18 are electrically connected to the connection electrodes 26 on the circuit board 10 positioned below the second solar section 17 via the coil springs 27. With this, only by placing the coil springs 27 between the contact terminals 23 of the coupling section 18 and the connection electrodes 26 on the circuit board 10, the contact terminals 23 of the coupling section 18 and the connection electrodes 26 on the circuit board 10 can be reliably and easily connected together.

In this case, the solar cells 20 of the first solar section 16, the solar cells 21 of the second solar section 17, and the contact terminals 23 of the coupling section 18 are formed on the same plane, that is, the upper surface, of the film. Therefore, only by bending the connecting section 22 of the coupling section 18 toward the area positioned below the second solar section 17, the contact terminals 23 of the coupling section 18 can be made to oppose the connection electrodes 26 on the circuit board 10. Thus, the contact terminals 23 of the coupling section 18 and the connection electrodes 26 on the circuit board 10 can be easily connected via the coil springs 27 in a simple manner, thereby improving the connecting operation.

Also, the coupling accommodating section 28 where the coupling section 18 is placed is provided so as to correspond to the paired connection electrodes 26 on the circuit board 10. The coupling accommodating section 28 includes the guide hole 28a where the first and second coupling pieces 24 and 25 are inserted and the accommodation recess 28b provided inside the housing 5 positioned below the outer perimeter of the second solar section 17 from the guide hole 28a. With this, in the coupling accommodating section 28, the contact terminals 23 of the coupling section 18 and the connection electrodes 26 on the circuit board 10 can be electrically connected via the coil springs 27.

In this case, the first and second coupling pieces 24 and 25 of the coupling section 18 and the connecting section 22 are inserted into the guide hole 28a of the coupling accommodating section 28, and the inserted connecting section 22 is bent toward inside of the accommodation recess 28b of the coupling accommodating section 28, thereby making the contact terminals 23 of the bent connecting section 22 oppose the connection electrodes 26 on the circuit board 10 in the accommodation recess 28b.

With this, only by placing the coil springs 27 between the connecting section 22 and the circuit board 10, the upper end of the coil springs 27 can be elastically brought in contact with the contact terminals 23 of the connecting section 22 and the lower end thereof can be elastically brought in contact with the connection electrodes 26 on the circuit board 10. Thus, the contact terminals 23 of the connecting section 22 and the connection electrodes 26 on the circuit board 10 can be reliably and excellently connected together via the coil springs 27.

Here, in the accommodation recess 28b of the coupling accommodating section 28, the connecting section 22 is pressed by the coil springs 27 onto the inner surface of the housing 5 positioned at the upper portion inside the accommodation recess 28b. Therefore, even though the coil springs 27 are used, the second solar section 17 and the lower hour plate 7 are not deformed by the spring force of the coil springs 27, and the occurrence of a pressure mark can be prevented. Thus, a device desirable in view of outer appearance and design can be obtained.

(Second Embodiment)

Next, an electronic watch according to a second embodiment to which the present invention has been applied is described with reference to FIG. 4 and FIG. 5. Portions identical to those in the first embodiment depicted in FIG. 1 to FIG. 3 are provided with the same reference numerals for description.

Figure 4:
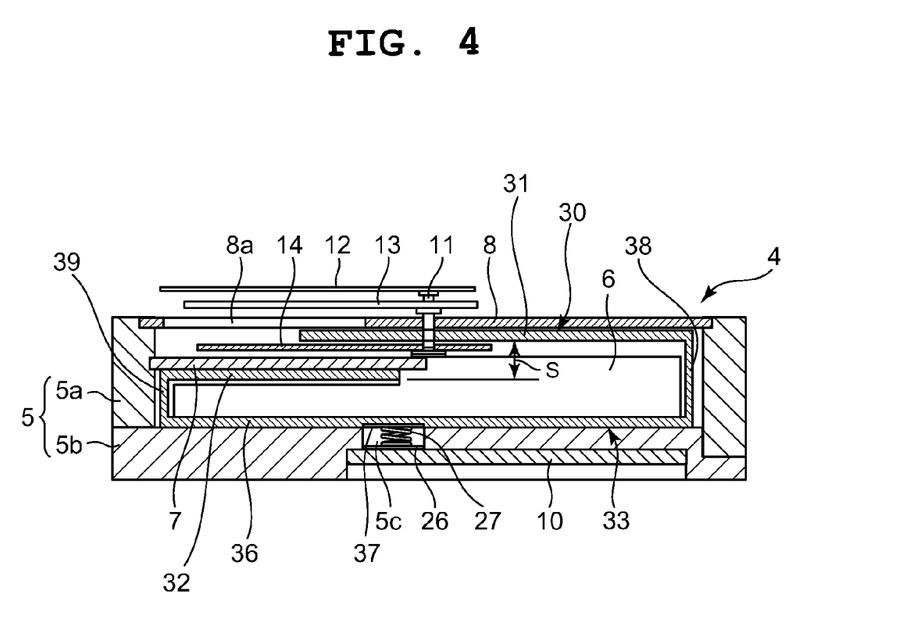
FIG. 4 is an enlarged sectional view of a second embodiment in which the present invention has been applied to an electronic watch.
Figure 5:
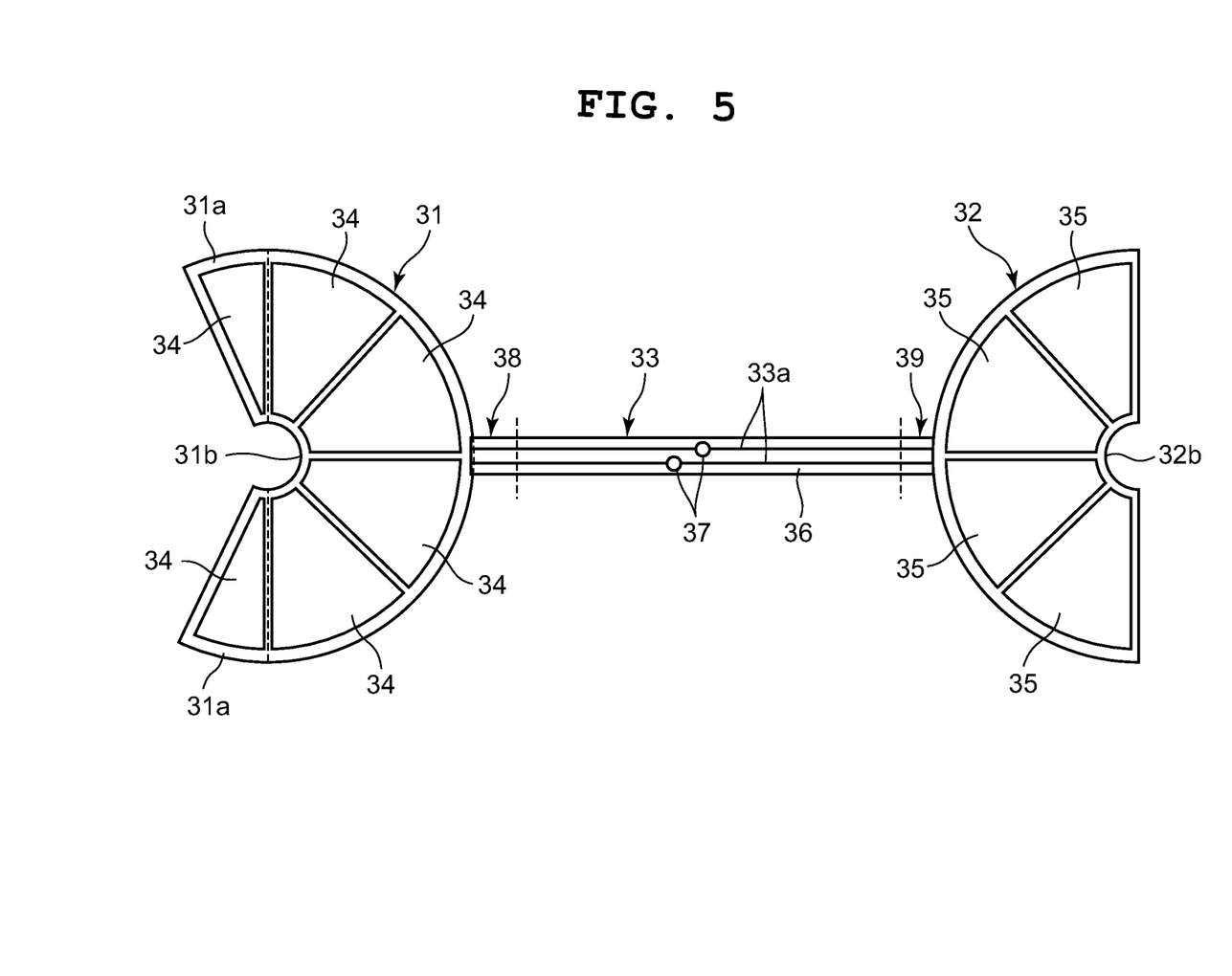
FIG. 5 is an enlarged development view in which a solar power device of the electronic watch depicted in FIG. 4 has been developed.

As depicted in FIG. 4 and FIG. 5, the electronic watch has a structure approximately similar to that of the first embodiment except that a solar power generating device 30 has a structure different from that of the first embodiment.

That is, as depicted in FIG. 4 and FIG. 5, the solar power generating device 30 includes a first solar section 31 placed on the lower surface of the upper hour plate 8, a second solar section 32 placed on the lower surface of the lower hour plate 7, and a coupling section 33 which couples the first and second solar sections 31 and 32 together. Also in this case, the first and second solar sections 31 and 32 and the coupling section 33 are integrally formed of a flexible film, as depicted in FIG. 5.

The first solar section 31 is formed in an approximately semicircular shape as depicted in FIG. 5, and has an upper surface on which a plurality of solar cells 34 are arranged flatwise. In this case, at a chord of the approximately semicircular shape of the first solar section 31, an overlap section 31a overlapping the second solar section 22, which will be descried further below, is provided so as to project in a surface direction.

The second solar section 32 is formed in an approximately semicircular shape as depicted in FIG. 5, and has an upper surface on which a plurality of solar cells 35 are arranged flatwise. As depicted in FIG. 4, the second solar section 32 is structured to be placed the predetermined space S away and below the first solar section 31 so as to hardly overlap the first solar section 31 and be shifted as being rotated almost 180 degrees in the surface direction.

That is, as depicted in FIG. 4, when the first solar section 31 and the second solar section 32 are three-dimensionally placed, they are placed as being vertically shifted so that chords of the respective semicircles oppose each other. Also, as depicted in FIG. 5, semicircular notched holes 31b and 32b where the pointer shaft 11 is inserted are provided each at an intermediate portion of each semicircle chords of the first solar section 31 and the second solar section 32, respectively.

As depicted in FIG. 4 and FIG. 5, the coupling section 33 is positioned between the first solar section 31 and the second solar section 32, and structured to bendably couple the first solar section 31 and the second solar section 32 together and to have a connecting section 36 placed in an area positioned below the second solar section 32, that is, along the lower surface of the clock movement 5. The connecting section 36 is provided with paired contact terminals 37 to which the first solar section 31 and the second solar section 32 are electrically connected.

As depicted in FIG. 5, the coupling section 33 is provided with a wiring pattern 33a for electrically connecting the solar cells 34 and 35 of the first and second solar sections 31 and 32 and the paired contact terminals 37 together. Also, the coupling section 33 has a connecting section 36 placed between the first solar section 31 and the second solar section 32, a first coupling piece 38 that couples one end (a left end in FIG. 5) of the connecting section 36 and the first solar section 31 together and also has a second coupling piece 39 that couples the other end (right end in FIG. 5) of the connecting section 36 and the second solar section 32 together.

In this case, as depicted in FIG. 4 and FIG. 5, the first coupling piece 38 is formed longer than the second coupling piece 29 by the predetermined space S in the vertical direction between the first solar section 31 and the second solar section 32, that is, by the predetermined space S above the lower hour plate 7 and below the upper hour plate 8. The connecting section 36 of the coupling section 33 is formed in a band shape with a length equal to or slightly longer than the length of the clock movement 6.

As depicted in FIG. 5, the first coupling piece 38 is bendably coupled to one end (left end in FIG. 5) of the connecting section 36 and an intermediate portion on the outer perimeter of the approximately semicircular shape of the first solar section 31. The second coupling piece 39 is bendably coupled to the other end (right end in FIG. 5) of the connecting section 36 and an intermediate portion on the outer perimeter of the approximately semicircular shape of the second solar section 32.

With this, as depicted in FIG. 4 and FIG. 5, the coupling section 33 is structured to be placed so that the first coupling piece 38 and the second coupling piece 39 project toward both sides of the clock movement 6 when the connecting section 36 is placed along the lower surface of the clock movement 6. The first coupling piece 38 of the coupling section 33 is structured to be bent upward at one end (a right end in FIG. 4) of the connecting section 36 positioned at an end of the clock movement 6 and to bend the first solar section 31 at the bent upper portion of the first coupling piece 38 and place the first solar section 31 below the upper hour plate 8.

Similarly, as depicted in FIG. 4 and FIG. 5, the second coupling section 39 is structured to be bent upward at the other end (a left end in FIG. 4) of the connecting section 36 positioned at the end of the clock movement 6 and to bend the second solar section 32 at the bent upper portion of the second coupling piece 39 and place the second solar section 32 below the lower hour plate 7.

As with the first embodiment, the contact terminals 37 of the coupling section 33 are structured to be electrically connected to the paired connection electrodes 26 on the circuit board 10 placed in the housing 5 via the paired coil springs 27. In this case, as depicted in FIG. 4, the housing 5 includes an upper housing 5a and a lower housing 5b. The upper housing 5a is structured to have the clock movement 6 placed therein.

As depicted in FIG. 4, the lower housing 5b is placed below the upper housing 5a. On the lower portion of the lower housing 5b, the circuit board 10 is placed. Also, the lower housing 5b is provided with a spring insertion hole 5c vertically penetrating therethrough, in which the paired coil springs 27 are inserted. The spring insertion hole 5c is provided corresponding to the paired connection electrodes 26 on the circuit board 10.

Also in this case, as depicted in FIG. 4, the paired coil springs 27 are structured to be placed between the connecting section 36 and the circuit board 10. In this state, with the upper end of the paired coil springs 27 elastically in contact with the contact terminals 37 of the connecting section 36, the connecting section 36 is pressed onto the housing 5, and the lower end thereof is elastically in contact with the connection electrodes 26 of the circuit board 10. With this, the contact terminals 23 of the connecting section 22 and the connection electrodes 26 of the circuit board 10 are electrically connected together.

Next, a case of manufacturing the solar power generating device 30 is described.

In this case, as with the first embodiment, the solar cells 34 and 35, the contact terminals 37, and the wiring pattern 33a are formed at predetermined positions on the same plane of one flexible film, and the film is then cut along the solar cells 34 and 35 and the wiring pattern 33a. With this, as depicted in FIG. 5, the first and second solar sections 31 and 32 and the coupling section 33 are formed as being integrally coupled together and developed.

In this state, as depicted in FIG. 5, the first solar section 31 is formed in an approximately semicircular shape, with its chord of the approximately semicircular shape oriented to the left. The second solar section 32 is formed in an approximately semicircular shape, with its chord of the approximately semicircular shape oriented to the right. The semicircles of the first solar section 31 and the second solar section 32 are thus placed back-to-back. In this state, the coupling section 33 is placed as being coupled to the outer perimeter of the approximately semicircular shape of the first solar section 31 and the outer perimeter of the approximately semiconductor shape of the second solar section 32.

In this case, as depicted in FIG. 5, the first coupling piece 38 is formed longer than the second coupling piece 39 by the predetermined space S above the lower hour plate 7 and below the upper hour plate 8. Also in this state, the solar cells 34 of the first solar section 31 and the solar cells 35 of the second solar section 32 are formed on the upper surface of the film, and the contact terminals 37 of the coupling section 33 are also formed on the upper surface of the film. Therefore, the solar cells 34 and 35 are electrically connected to the contact terminals 37 of the coupling section 33 via the wiring pattern 33a on the same plane, that is, the upper surface, of the film.

Next, a case of assembling this solar power generating device 30 to the clock module 4 is described.

In this case, the first and second solar sections 31 and 32 and the coupling section 33 are turned inside out to cause the solar cells 34 and 35 and the contact terminals 37 oriented downward in advance. In this state, the connecting section 36 of the coupling section 33 is placed below the clock movement 6, and the first and second coupling pieces 38 and 39 are made project toward both sides of the clock movement 6.

Then, as depicted in FIG. 4, after the second coupling piece 39 is bent upward at an end of the connecting section 36 of the coupling section 33, the second solar section 32 is bent upward to the clock movement 6 at the upper end of the second coupling piece 39, thereby placing the lower hour plate 7 on the second solar section 32. Then, the pointer shaft 11 is inserted into a shaft insertion hole (not shown) of the lower hour plate 7 and the notched hole 32b of the second solar section 32.

In this state, after the display rotor plate 14 is mounted on the pointer shaft 11 projecting above the lower hour plate 7, the first coupling piece 36 is bent upward at an end of the connecting section 36 of the coupling section 33. Then, the first solar section 31 is bent upward to the clock movement 6 at the upper end of the first coupling piece 38, thereby placing the upper hour plate 8 on the first solar section 31. Also here, the pointer shaft 11 is inserted into a shaft insertion hole (not shown) of the upper hour plate 8 and the notched hole 31b of the first solar section 31.

With this, the solar cells 34 and 35 of the first solar section 31 and the second solar section 32 are placed so as to be oriented upward, and the paired contact terminals 37 provided to the connecting section 36 of the coupling section 33 are placed so as to be oriented downward. In this state, the clock movement 6 is placed inside the upper housing 5a, and the lower housing 5b is placed below the upper housing 5a. Here, the paired contact terminals 37 of the coupling section 33 correspond to the spring insertion hole 5c of the lower housing 5b.

In this state, the paired coil springs 27 are placed inside the spring insertion hole 5c of the lower housing 5b positioned below the paired contact terminals 37, and the circuit board 10 is mounted on the lower surface of the lower housing 5b via a board presser plate (not shown). With this, as depicted in FIG. 4, the paired coil springs 27 are interposed between the connecting section 36 and the circuit board 10. In this state, the upper end of the coil springs 27 is elastically in contact with the contact terminals 37 of the connecting section 36 to press the connecting section 36 onto the lower housing 5b. Also, the lower end of the coil springs 27 is elastically in contact with the connection electrodes 26 of the circuit board 10.

With this, with the paired contact terminals 37 of the connecting section 36 and the paired connection electrodes 26 of the circuit hoard 10 being electrically connected together, the solar power generating device 30 is assembled to the housing 5. Then, with the minute hand 12 and the hour hand 13 being mounted on the upper portion of the pointer shaft 11 projecting upward from the upper hour plate 8, the solar power generating device 30 and the housing 5 are incorporated in the watch case 1.

Next the operation of the electronic watch as described above is described.

In the electronic watch, as with the first embodiment, the minute hand 12 and the hour hand 13 move above the upper hour plate 8 to indicate the current time. Also, when the display rotor plate 14 is rotated by the clock movement 6 and part of the information display section 14a of the display rotor plate 14 is exposed so as to correspond to the display opening 8a of the upper hour plate 8, one of the city names on the information display section 14a is indicated and displayed by the indication mark 8b, and the minute hand 12 and the hour hand 13 more to indicate the time in the indicated and displayed city.

Also in this state, external light enters the watch case 1 through the clock glass 2 and, by this incident external light the solar power generating device 30 generates power. That is, of the external light entering the watch case 1, light applied to the upper hour plate 8 transmits through the upper hour plate 8 to be applied to the first solar section 31 and, by this applied light, the solar cells 34 of the first solar section 31 generate power.

Similarly, light transmitting through the display opening 8a of the upper hour plate 8 transmits through the display rotor plate 14 to be applied to the lower hour plate 7. Then, the applied light further transmits through the lower hour plate 7 to be applied to the second solar section 32. By this applied light, the solar cells 35 of the second solar section 32 generate power. Here, even though the overlap section 31a is provided to the first solar section 31, light goes below the overlap section 31a to be applied to the second solar section 32. Therefore, the second embodiment generates power more than the first embodiment.

As with the first embodiment, thus generated power is sent from the paired contact terminals 37 of the coupling section 33 via the paired coil springs 27 to the paired connection electrodes 26 of the circuit board 10, and is then temporarily accumulated in a power supply section (not shown) such as a capacitor of the circuit board 10. By this accumulated power, the clock movement 6 is driven.

As such, according to the solar power generating device 30 of the electronic watch, operations and effects similar to those of the first embodiment can be provided. In addition, the coupling section 33 is placed between the first solar section 31 and the second solar section 32. Also, the first coupling piece 38 of the coupling section 33 is bendably coupled to one end of the connecting section 36 of the coupling section 33 and the intermediate portion on the outer perimeter of the first solar section 31, the second coupling piece 32 is bendably coupled to the other end of the connecting section 36 and the intermediate portion on the outer perimeter of the second solar section 32, and the first coupling piece 38 is formed so as to have a length longer than the length of the second coupling piece 39. Therefore, only by bending the first coupling piece 38 and the second coupling piece 39, the first solar section 31 and the second solar section 32 can be easily placed so as to be shifted by the predetermined space S in the vertical direction.

Therefore, as with the first embodiment, there is no need to individually assemble and individually connect the first and second solar sections 31 and 32, and these solar sections can be assembled and connected all together. Therefore, even though the device includes the plurality of solar sections 31 and 32, these can be integrated to simplify the assembling operation and the connecting operation. Also in this case, even though the first and second solar sections 31 and 32 have different heights according to the heights of the lower hour plate 7 and the upper hour plate 8, the first and second solar sections 31 and 32 can be excellently placed via the coupling section 33, and the light-receiving area can be ensured. Also a sufficient amount of power generation can be ensured.

Furthermore, also in this case, the contact terminals 37 and the wiring pattern 33a are formed only on one side of the coupling section 33, and there is no need to form a wiring pattern on both sides. Therefore, as with the first embodiment, the coupling section 33 can be easily manufactured. Also since the contact terminals 37 are provided to the connecting section 36 of the coupling section 33, the contact terminals 37 can be provided at any positions of the connecting section 36. Thus, the positions of the contact terminals 37 can be freely set. As with the first embodiment, this facilitates pattern designing of the connection electrodes 26 of the circuit board 10 and others, thereby increasing flexibility in pattern designing of the circuit board 10.

Still further, the solar cells 34 of the first solar section 31, the solar cells 35 of the second solar section 32, and the contact terminals 37 of the coupling section 33 are formed on the same plane of the film. Therefore, only by orienting the first solar section 31, the second solar section 32, and the coupling section 33 downward and sequentially bending the first and second solar sections 31 and 32 by the first and second coupling pieces 38 and 39 of the coupling section 33, respectively, the contact terminals 37 of the coupling section 33 can be reliably and easily connected so as to oppose the connection electrodes 26 on the circuit board 10 via the coil springs 27, with the solar sections 31 and 32 being placed at different heights. With this, the connecting operation can be improved.

(Third Embodiment)

Next, an electronic watch according to a third embodiment to which the present invention has been applied is described with reference to FIG. 6 and FIG. 7. In this case, portions identical to those in the second embodiment depicted in FIG. 4 and FIG. 5 are provided with the same reference numerals for description.

Figure 6:
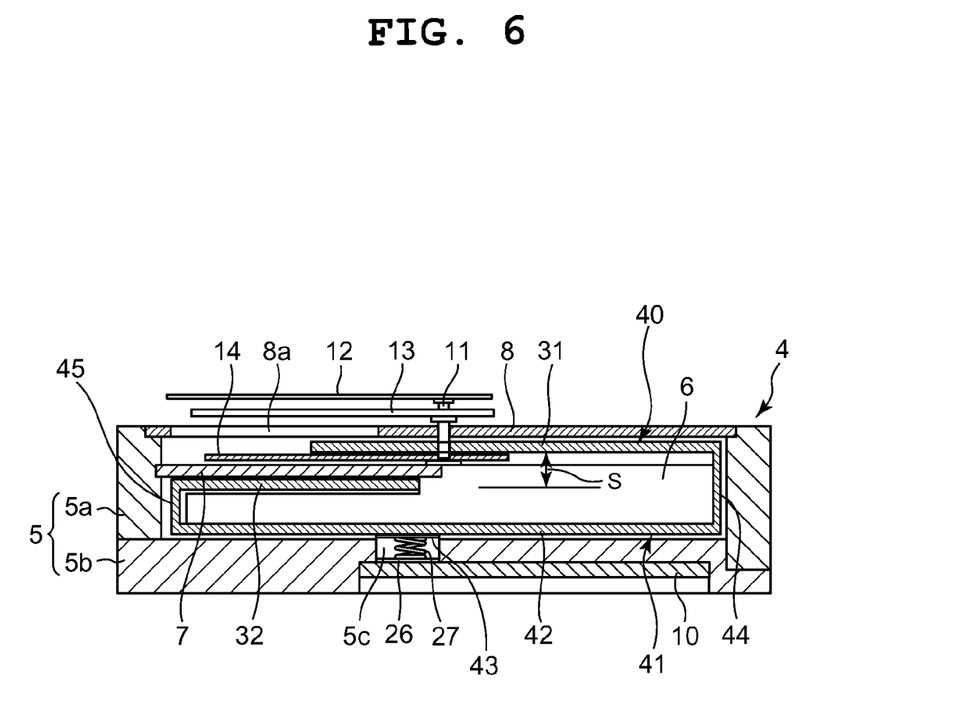
FIG. 6 is an enlarged sectional view of a third embodiment in which the present invention has been applied to an electronic watch.
Figure 7:
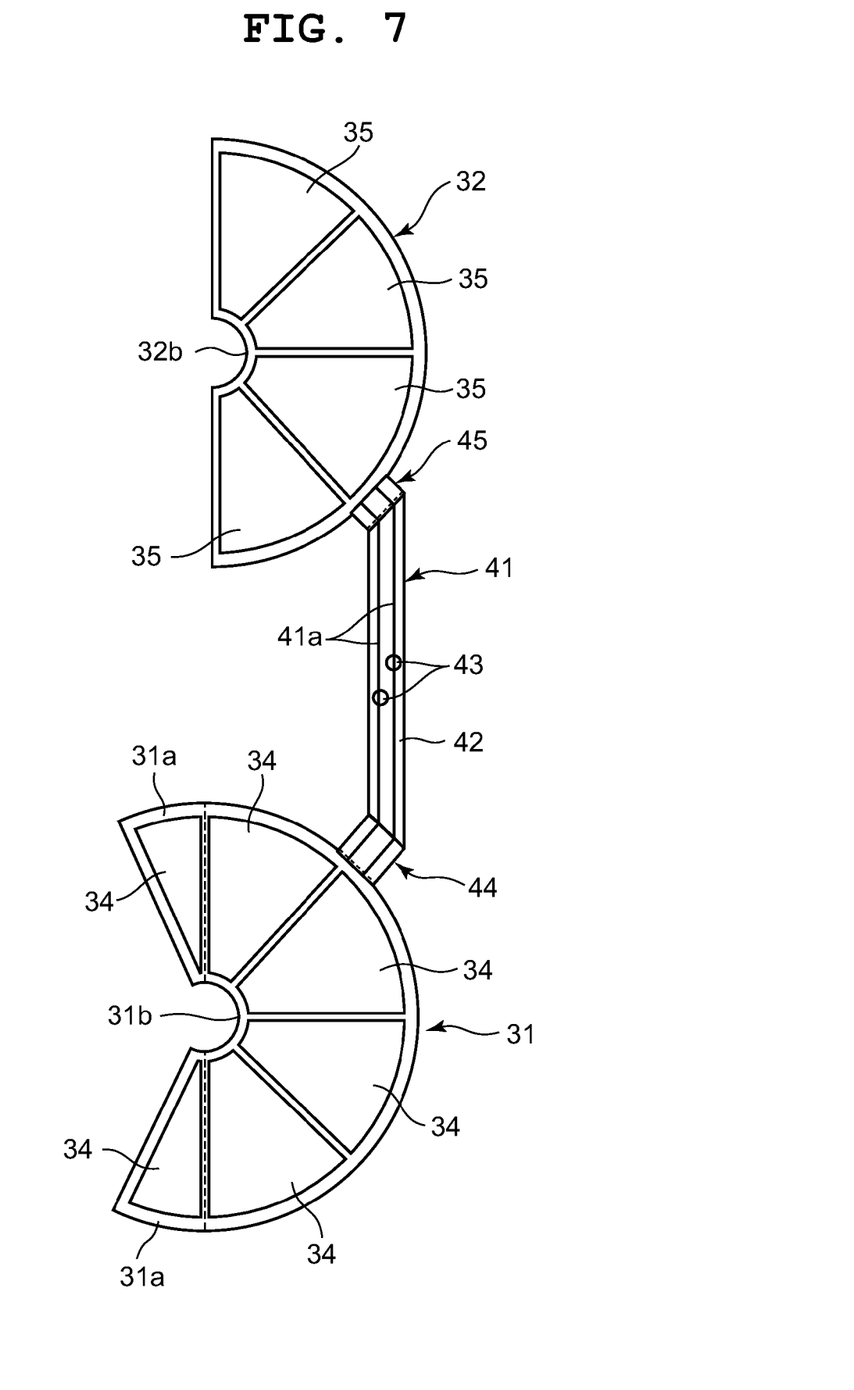
FIG. 7 is an enlarged development view in which a solar power device of the electronic watch depicted in FIG. 6 has been developed.

As depicted in FIG. 6 and FIG. 7, the electronic watch has a structure approximately similar to that of the second embodiment except that a coupling section 41 of a solar power generating device 40 has a structure different from that of the second embodiment.

As depicted in FIG. 6 and FIG. 7, the solar power generating device 40 includes the first solar section 31 placed on the lower surface of the upper hour plate 8, the second solar section 32 placed on the lower surface of the lower hour plate 7, and the coupling section 41 which couples the first and second solar sections 31 and 32 together. Also in this case, the first and second solar sections 31 and 32 and the coupling section 41 are integrally formed of a flexible film, as depicted in FIG. 7.

As depicted in FIG. 6 and FIG. 7, the coupling section 41 is positioned between the first solar section 31 and the second solar section 32, and structured to bendably couple the first solar section 31 and the second solar section 32 together. The coupling section 41 also has a connecting section 42 placed in an area positioned below the second solar section 32, that is, along the lower surface of the clock movement 6, the connecting section 42 being provided with paired contact terminals 43 to which the first solar section 31 and the second solar section 32 are electrically connected.

As depicted in FIG. 7, the coupling section 41 is provided with a wiring pattern 41a for electrically connecting the solar cells 34 and 35 of the first and second solar sections 31 and 32 and the paired contact terminals 43 together. Also, the coupling section 41 has a connecting section 42 placed between the first solar section 31 and the second solar section 32, a first coupling piece 44 that couples one end (lower end in FIG. 7) of the connecting section 42 and the first solar section 31 together and also has a second coupling piece 45 that couples the other end (upper end in FIG. 7) of the connecting section 42 and the second solar section 32 together.

Also in this case, as depicted in FIG. 6 and FIG. 7, the first coupling piece 44 is formed longer than the second coupling piece 45 by the predetermined space S in the vertical direction between the first solar section 31 and the second solar section 32. As depicted in FIG. 7, the connecting section 42 of the coupling section 41 is formed in a band shape with a length shorter than the length of cart of the clock movement 6, that is, the longest part of the clock movement 6.

As depicted in FIG. 7, the first coupling piece 44 has one end slanted (in the right downward direction in FIG. 7) and bendably coupled to one end (lower end in FIG. 7) of the connecting section 42 and has the other end bendably coupled to the outer perimeter of the approximately semicircular shape of the first solar section 31. The second coupling piece 45 has one end slanted (in the right upward direction in FIG. 7) and bendably coupled to the other end (upper end in FIG. 7) of the connecting section 42 and has the other end bendably coupled to the outer perimeter of the approximately semicircular shape of the second solar section 32.

In this case, as depicted in FIG. 7, the first coupling piece 44 has one end slanted at an angle, for example, on the order of 45 degrees, and bendably coupled to one end (the lower end in FIG. 7) of the connecting section 42. The second coupling piece 45 has one end slanted at an angle approximately orthogonal to the tilt angle in the first coupling piece 44 and bendably coupled to the other end (the upper end in FIG. 7) of the connecting section 42.

With this, as depicted in FIG. 6 and FIG. 7, the coupling section 41 is structured to be placed so that the first coupling piece 44 and the second coupling piece 45 project toward both sides of the clock movement 6 when the connecting section 42 is placed along the lower surface of the clock movement 6. The first coupling piece 44 of the coupling section 41 is structured to be slantly bent upward at one end (a right end in FIG. 6) of the connecting section 42 positioned at an end of the clock movement 6 and to bend the first solar section 31 at the slantly bent upper portion of the first coupling piece 44 and place the first solar section 31 below the upper hour plate 8.

Similarly, as depicted in FIG. 6 and FIG. 7, the second coupling section 45 is structured to be slantly bent upward at the other end (a left end in FIG. 6) of the connecting section 42 positioned at the end of the clock movement 6 and to bend the second solar section 32 at the slantly bent upper portion of the second coupling section 45 and place the second solar section 32 below the lower hour plate 7.

As with the second embodiment, the contact terminals 43 of the coupling section 41 are structured to be electrically connected to the paired connection electrodes 26 on the circuit board 10 placed on the lower surface of the lower housing 5 via the paired coil springs 27. In this case, as depicted in FIG. 6, the paired coil springs 27 are placed between the connecting section 42 and the circuit board 10 in the spring insertion hole 5c of the lower housing 5b.

With this, as depicted in FIG. 6, the paired coil springs 27 are structured to have their upper end elastically in contact with the contact terminals 43 of the connecting section 42 to press the connecting section 42 onto the housing 5 and have their lower end elastically in contact with the connection electrodes 26 of the circuit board 10. With this, the contact terminals 43 of the connecting section 42 and the connection electrodes 26 of the circuit board 10 are electrically connected together.

Next, a case of manufacturing the solar power generating device 40 is described.

In this case, as with the second embodiment, the solar cells 34 and 35, the contact terminals 43, and the wiring pattern 41a are formed at predetermined positions on the same plane of one flexible film, and the film is then cut along the solar cells 34 and 35 and the wiring pattern 41a. With this, as depicted in FIG. 7, the first and second solar sections 31 and 32 and the coupling section 41 are formed as being integrally coupled together and developed.

In this state, as depicted in FIG. 7, the first solar section 31 is formed in an approximately semicircular shape, with its chord of the approximately semicircular shape oriented to the left. The second solar section 32 is formed in an approximately semicircular shape, with its chord of the approximately semicircular shape oriented to the left. The first solar section 31 and the second solar section 32 are thus placed away from each other in the vertical direction. In this state, the coupling section 41 is placed with it being coupled to the outer perimeter of the approximately semicircular shape of the first solar section 31 and the outer perimeter of the approximately semiconductor shape of the second solar section 32.

In this case, as depicted in FIG. 7, the first coupling piece 44 is formed longer than the second coupling piece 45 by the predetermined space S above the lower hour plate 7 and below the upper hour plate 8. Also, the first coupling piece 44 is slanted in the right downward direction to be coupled to one end (lower end in FIG. 7) of the connecting section 42. Similarly, the second coupling piece 45 is slanted in the right upward direction to be coupled to the other end (upper end in FIG. 7) of the connecting section 42.

Also, the solar cells 34 of the first solar section 31 and the solar cells 35 of the second solar section 32 are formed on an upper surface of the film, and the contact terminals 43 of the coupling section 41 are also formed on the upper surface of the film. Therefore, the solar cells 34 and 35 are electrically connected to the contact terminals 43 of the coupling section 41 via the wiring pattern 41a on the same plane, that is, the upper surface, of the film.

Next, a case of assembling this solar power generating device 40 to the clock module 4 is described.

In this case, as with the second embodiment, the first and second solar sections 31 and 32 and the coupling section 41 are turned inside out to cause the solar cells 34 and 35 and the contact terminals 43 oriented downward in advance. In this state, the connecting section 42 of the coupling section 41 is placed below the clock movement 6, and the first and second coupling pieces 44 and 45 are made project toward both sides of the clock movement 6.

Then, as depicted in FIG. 6, the second coupling piece 45 is bent upward at an end of the connecting section 42 of the coupling section 41, and the second solar section 32 is bent upward to the clock movement 6 at the upper end of the second coupling piece 45, thereby placing the lower hour plate 7 on the second solar section 32. Then, the pointer shaft 11 is inserted into a shaft insertion hole (not shown) of the lower hour plate 7 and the notched hole 32b of the second solar section 32.

In this state, after the display rotor plate 14 is mounted on the pointer shaft 11 projecting above the lower hour plate 7, the first coupling piece 44 is bent upward at the end of the connecting section 42 of the coupling section 41. Then, the first solar section 31 is bent upward to the clock movement 6 at the upper end of the first coupling piece 44, thereby placing the upper hour plate 8 on the first solar section 31. Also here, the pointer shaft 11 is inserted into a shaft insertion hole (not shown) of the upper hour plate 8 and the notched hole 31b of the first solar section 31.

With this, the solar cells 34 and 35 of the first solar section 31 and the second solar section 32 are placed so as to be oriented upward, and the paired contact terminals 43 provided to the connecting section 42 of the coupling section 41 are placed so as to be oriented downward. In this state, as with the second embodiment, the clock movement 6 is placed inside the upper housing 5a, and the lower housing 5b is placed below the upper housing 5a. Here, the paired contact terminals 43 of the coupling section 41 correspond to the spring insertion hole 5c of the lower housing 5b.

In this state, the paired coil springs 27 are placed inside the spring insertion hole 5c of the lower housing 5b positioned below the paired contact terminals 43, and the circuit board 10 is mounted on the lower surface of the lower housing 5b via a board presser plate (not shown). With this, as depicted in FIG. 6, the paired coil springs 27 are interposed between the connecting section 42 and the circuit board 10. In this state, the upper end of the coil springs 27 is elastically in contact with the contact terminals 43 of the connecting section 42 to press the connecting section 42 onto the lower housing 5b. Also, the lower end of the coil springs 27 is elastically in contact with the connection electrodes 26 of the circuit board 10.

With this, with the paired contact terminals 43 of the connecting section 42 and the paired connection electrodes 26 of the circuit board 10 being electrically connected together, the solar power generating device 40 is assembled to the housing 5. Then, with the minute hand 12 and the hour hand 13 being mounted on the upper portion of the pointer shaft 11 projecting upward from the upper hour plate 8, the solar power generating device 40 and the housing 5 are incorporated in the watch case 1.

Next, the operation of the electronic watch described above is described.

In the electronic watch, as with the first embodiment, the minute hand 12 and the hour hand 13 move above the upper hour plate 8 to indicate the current time. Also, the display rotor plate 14 is rotated by the clock movement 6 and part of the information display section 14a of the display rotor plate 14 is exposed so as to correspond to the display opening 8a of the upper hour plate 8. Then, one of the city names on the information display section 14a is indicated and displayed by the indication mark 8b, and the minute hand 12 and the hour hand 13 move to indicate the time in the indicated and displayed city.

Also in this state, external light enters the watch case 1 through the clock glass 2 and, by this incident external light the solar power generating device 40 generates power, as with the second embodiment. That is, of the external light entering the watch case 1, light applied to the upper hour plate 8 transmits through the upper hour plate 8 to be applied to the first solar section 31 and, by this applied light, the solar cells 34 of the first solar section 31 generate power.

Similarly, light transmitting through the display opening 8a of the upper hour plate 8 transmits through the display rotor plate 14 to be applied to the lower hour plate 7. Then, the applied light further transmits through the lower hour plate 7 to be applied to the second solar section 32. By this applied light, the solar cells 35 of the second solar section 32 generate power. Here, even though the overlap section 31a is provided to the first solar section 31, light goes below the overlap section 31a to be applied to the second solar section 32. Therefore, the third embodiment generates power more than the first embodiment.

As with the first embodiment, thus generated power is sent from the paired contact terminals 43 of the coupling section 41 via the paired coil springs 27 to the paired connection electrodes 26 of the circuit board 10, and is then temporarily accumulated in a power supply section (not shown) such as a capacitor of the circuit board 10. By this accumulated power, the clock movement 6 is driven.

As such, according to the solar power generating device 40 of the electronic watch, operations and effects similar to those of the second embodiment can be provided. In addition, the first coupling piece 44 of the coupling section 41 is bendably coupled to one end of the connecting section 42 and the outer perimeter of the first solar section 31, and the second coupling piece 32 is bendably coupled to the other end of the connecting section 42 and the outer perimeter of the second solar section 32. Therefore, only by bending the first coupling piece 44 and the second coupling piece 45, the first solar section 31 and the second solar section 32 can be easily placed so as to be shifted by the predetermined space S in the vertical direction.

In this case, the first coupling piece 44 of the coupling section 41 has one end slantly and bendably coupled to one end of the connecting section 42 and has the other end bendably coupled to the outer perimeter of the first solar section 31. The second coupling piece 45 has one end slantly and bendably coupled to the other end of the connecting section 42 and has the other end bendably coupled to the outer perimeter of the second solar section 32. Thus, with the connecting section 42 being placed at a position shifted from each center of the clock movement 6 and the housing 5, the first solar section 31 and the second solar section 32 can be easily placed so as to be shifted by the predetermined space S in the vertical direction.

Therefore, also in the solar power generating device 40, there is no need to individually assemble and individually connect the first and second solar sections 31 and 32, and these solar sections can be assembled and connected all together. Therefore, even though the device includes the plurality of solar sections 31 and 32, these can be integrated to simplify the assembling operation and the connecting operation. With this, the connection space can be minimized and thereby the entire device can be downsized. Furthermore, even though the lower hour plate 7 and the upper hour plate 3 have different heights, the first and second solar sections 31 and 32 can be excellently placed via the coupling section 41.

Also in this case, the contact terminals 43 and the wiring pattern 41a are formed only on one side of the coupling section 41, and there is no need to form a wiring pattern on both sides. Therefore, as with the second embodiment, the coupling section 41 can be easily manufactured. Also, since the contact terminals 43 are provided to the connecting section 42 of the coupling section 41, the contact terminals 43 can be provided at any positions of the connecting section 42. Thus, the positions of the contact terminals 43 can be freely set. As with the second embodiment, this facilitates pattern designing of the connection electrodes 26 of the circuit board 10 and others. Thus, flexibility in pattern designing of the circuit board 10 can be increased.

While the case has been described in the above first to third embodiments in which the first solar sections 16 and 31 and the second solar sections 17 and 32 are each formed in an approximately semicircular shape it is not necessarily required to form these solar sections each in a semicircular shape. For example, each solar section may have a shape of an approximately half of a polygon such as a hexagon or an octagon, or a shape of an approximately half of an oval.

Also, while the case has been described in the above first to third embodiments in which the contact terminals 23, 37, and 43 provided to the connecting sections 22, 36, and 42 of the coupling sections 18, 33, and 41, respectively, and the connection electrodes 26 of the circuit board 10 are electrically connected together via the coil springs 27, the connection via the coil springs 27 is not necessarily required. For example, the structure may be such that the electrical connection is made via a connecting member such as an interconnector.

Furthermore, while the case has been described in the above first to third embodiments in which world's main cities are displayed on the information display section 14a of the display rotor plate 14, it is not necessarily required to display world's main cities on the information display section 14a. The present invention may be structured to display, for example, temperature, humidity, atmospheric pressure, the waxing and waning of the moon, the rise and fall of the tides, etc.

Still further, while the case has been described in the above first to third embodiments in which the present invention is applied to an electronic watch, it is not necessarily required to apply the present invention to an electronic watch. The present invention can be widely applied to various electronic timepieces, for example, a travel watch, an alarm clock, a table clock, a wall clock, etc.

While the present invention has been described with reference to the preferred embodiments, it is intended that the invention be not limited by any of the details of the description therein but includes all the embodiments which fall within the scope of the appended claims.

What is claimed is:

1. A solar power generating device comprising:
    a first solar section which has a plurality of solar cells arranged flatwise;
    a second solar section which has a plurality of solar cells arranged flatwise and is placed a predetermined distance away and below the first solar section so as to be shifted with respect to the first solar section in a surface direction; and
    a coupling section which couples the first solar section and the second solar section together,
    wherein the coupling section has a connecting section placed in an area below the second solar section, and the connecting section is provided with contact terminals to which the first solar section and the second solar section are electrically connected.

2. The solar power generating device according to claim 1, wherein the first solar section, the second solar section, and the coupling section are integrally coupled together and formed of a flexible film.

3. The solar power generating device according to claim 1, wherein the coupling section has a first coupling piece which couples the connecting section and the first solar section together and a second coupling piece which couples the connecting section and the second solar section together, and
    wherein the first coupling piece is formed longer than the second coupling piece by the predetermined space between the first solar section and the second solar section in a vertical direction.

4. The solar power generating device according to claim 2, wherein the coupling section has a first coupling piece which couples the connecting section and the first solar section together and a second coupling piece which couples the connecting section and the second solar section together, and
    wherein the first coupling piece is formed longer than the second coupling piece by the predetermined space between the first solar section and the second solar section in a vertical direction.

5. The solar power generating device according to claim 3, wherein
    (a) the coupling section is positioned on a side of each of the first solar section and the second solar section,
    (b) the first coupling piece is bendably coupled to one end of outer perimeter of the first solar section and one side of the connecting section, and
    (c) the second coupling piece is bendably coupled to one end of outer perimeter of the second solar section adjacent to the one end of the first solar section and the one side of the connecting section in a state in parallel to the first coupling piece.

6. The solar power generating device according to claim 4, wherein
    (a) the coupling section is positioned on a side of each of the first solar section and the second solar section,
    (b) the first coupling piece is bendably coupled to one end of outer perimeter of the first solar section and one side of the connecting section, and
    (c) the second coupling piece is bendably coupled to one end of outer perimeter of the second solar section adjacent to the one end of the first solar section and the one side of the connecting section in a state in parallel to the first coupling piece.

7. The solar power generating device according to claim 3, wherein
    (a) the coupling section is positioned between the first solar section and the second solar section,
    (b) the first coupling piece is bendably coupled to an intermediate portion of outer perimeter of the first solar section and one end of the connecting section, and
    (c) the second coupling piece is bendably coupled to an intermediate portion of outer perimeter of the second solar section and another end of the connecting section.

8. The solar power generating device according to claim 4, wherein
    (a) the coupling section is positioned between the first solar section and the second solar section,
    (b) the first coupling piece is bendably coupled to an intermediate portion of outer perimeter of the first solar section and one end of the connecting section, and
    (c) the second coupling piece is bendably coupled to an intermediate portion of outer perimeter of the second solar section and another end of the connecting section.

9. The solar power generating device according to claim 3, wherein
    (a) the coupling section is positioned between the first solar section and the second solar section,
    (b) the first coupling piece has one end slantly and bendably coupled to one end of the connecting section and has another end bendably coupled to outer perimeter of the first solar section, and
    (c) the second coupling piece has one end slantly and bendably coupled to another end of the connecting section and has another end bendably coupled to outer perimeter of the second solar section.

10. The solar power generating device according to claim 4, wherein
    (a) the coupling section is positioned between the first solar section and the second solar section, (b) the first coupling piece has one end slantly and bendably coupled to one end of the connecting section and has another end bendably coupled to outer perimeter of the first solar section, and (c) the second coupling piece has one end slantly and bendably coupled to another end of the connecting section and has another end bendably coupled to outer perimeter of the second solar section.

11. The solar power generating device according to claim 1, wherein the contact terminals of the connecting section of the coupling section are electrically connected to connection electrodes on a circuit board positioned below the second solar section via connecting members.

12. The solar power generating device according to claim 2, wherein the contact terminals of the connecting section of the coupling section are electrically connected to connection electrodes on a circuit board positioned below the second solar section via connecting members.

13. The solar power generating device according to claim 3, wherein the contact terminals of the connecting section of the coupling section are electrically connected to connection electrodes on a circuit board positioned below the second solar section via connecting members.

14. The solar power generating device according to claim 4, wherein the contact terminals of the connecting section of the coupling section are electrically connected to connection electrodes on a circuit board positioned below the second solar section via connecting members.

15. The solar power generating device according to claim 5, wherein the contact terminals of the connecting section of the coupling section are electrically connected to connection electrodes on a circuit board positioned below the second solar section via connecting members.

16. The solar power generating device according to claim 7, wherein the contact terminals of the connecting section of the coupling section are electrically connected to connection electrodes on a circuit board positioned below the second solar section via connecting members.

17. The solar power generating device according to claim 9, wherein the contact terminals of the connecting section of the coupling section are electrically connected to connection electrodes on a circuit board positioned below the second solar section via connecting members.

18. An electronic timepiece comprising:
the solar power generating device according to claim 1.

19. An electronic timepiece comprising:
the solar power generating device according to claim 2.

20. An electronic timepiece comprising:
the solar power generating device according to claim 3.

* * * * *